(12) United States Patent
Woolrich et al.

(10) Patent No.: US 9,735,088 B2
(45) Date of Patent: Aug. 15, 2017

(54) SYSTEMS AND METHODS FOR THERMAL CONTROL OF INTEGRATED CIRCUITS

(71) Applicants: Kyle A. Woolrich, El Segundo, CA (US); Jonathan M. Allison, Redondo Beach, CA (US); Thomas Rust, III, Manhattan Beach, CA (US); Robert E. Silhavy, Torrance, CA (US)

(72) Inventors: Kyle A. Woolrich, El Segundo, CA (US); Jonathan M. Allison, Redondo Beach, CA (US); Thomas Rust, III, Manhattan Beach, CA (US); Robert E. Silhavy, Torrance, CA (US)

(73) Assignee: The Boeing Company, Chicago, IL (US)

( * ) Notice: Subject to any disclaimer, the term of this patent is extended or adjusted under 35 U.S.C. 154(b) by 9 days.

(21) Appl. No.: 14/963,181

(22) Filed: Dec. 8, 2015

(65) Prior Publication Data
US 2017/0162473 A1    Jun. 8, 2017

(51) Int. Cl.
H01L 29/06   (2006.01)
H01L 23/46   (2006.01)
H01L 27/02   (2006.01)
H01L 21/50   (2006.01)

(52) U.S. Cl.
CPC ............. *H01L 23/46* (2013.01); *H01L 21/50* (2013.01); *H01L 27/0296* (2013.01)

(58) Field of Classification Search
None
See application file for complete search history.

(56) References Cited

U.S. PATENT DOCUMENTS

| 6,292,374 B1* | 9/2001 | Johnson ............... H05K 1/0204 174/252 |
| 8,912,643 B2 | 12/2014 | de Bock et al. |
| 2014/0160677 A1* | 6/2014 | de Bock ............. H01L 23/4735 361/689 |
| 2014/0239507 A1* | 8/2014 | Hsiao ...................... H01L 25/50 257/774 |

* cited by examiner

*Primary Examiner* — Calvin Choi
(74) *Attorney, Agent, or Firm* — Toler Law Group, PC

(57) ABSTRACT

A system includes a carrier defining a plurality of channels. The system includes an integrated circuit (IC) die having a first side and having a second side opposite the first side. The second side of the IC die is coupled to the carrier. The system includes a die attach layer between the carrier and the second side of the IC die. The die attach layer defines one or more openings that enable a fluid to flow from the carrier to the second side of the IC die.

20 Claims, 11 Drawing Sheets

SYSTEMS AND METHODS FOR THERMAL CONTROL OF INTEGRATED CIRCUITS

GOVERNMENT LICENSE RIGHTS

The invention was made with Government support under contract number FA8650-14-C-7464 awarded by the Department of Defense. The government has certain rights in this invention.

FIELD

The present disclosure generally relates to systems and methods for thermal control of integrated circuits.

BACKGROUND

Integrated circuit (IC) die theiiiial control techniques, such as techniques that employ a eutectic solder die attach, may cool the IC die by acquiring heat (from the IC die) that is conducted (e.g., via solid conduction) through one or more layers external to the IC die. For example, techniques that employ a eutectic solder die attach may acquire heat conducted through the IC die, through the solder die attach, and through a carrier. Acquisition of heat from the IC die after the heat has been conducted through layers external to the IC die (e.g., through the solder die attach and/or through a carrier) may limit the capacity of these techniques to remove heat from the IC die, which may result in excessive operational temperatures of the IC die or in limiting allowable power output.

SUMMARY

In an embodiment, a device includes a carrier defining a plurality of channels. The device includes an integrated circuit (IC) die having a first side and having a second side opposite the first side. The second side of the IC die may be coupled to the carrier. The IC die includes a conductive path between the first side of the IC die and the carrier. The plurality of channels is configured to route a fluid to the second side of the IC die.

In another embodiment, a device includes a carrier defining a plurality of channels. The device includes an IC die having a first side and having a second side opposite the first side. The second side of the IC die may be coupled to the carrier. The device includes a die attach layer between the carrier and the second side of the IC die. The die attach layer defines one or more openings that enable a fluid to flow from the carrier to the second side of the IC die.

In another embodiment, a method of assembling includes aligning a carrier with an IC die to expose one or more etch indents at a substrate of the IC die to a plurality of channels defined by the carrier. The method includes forming a hermetic seal between the carrier and the IC die by performing a die attach process to attach the carrier and the IC die using a die attach layer positioned between the IC die and the carrier. The die attach layer defines one or more openings that enable a fluid to flow from the carrier to the one or more etch indents.

Advantageously, the system removes heat from an IC die. One IC die, Gallium Nitride (GaN) Monolithic Microwave Integrated Circuit (MMIC) can generate enhanced radio frequency power output, but requires improved thermal control over conventional devices to get full benefit of this enhanced capability. The system pumps a heat transfer fluid in and out through a window of the IC die enabling fluidic microcooler thermal control underneath a radio frequency IC, such as GaN MMIC, which allows increased performance such as higher operational temperatures and higher power output.

The features, functions, and/or advantages described herein may be achieved independently in various embodiments or may be combined in yet other embodiments further details of which can be seen with reference to the following description and drawings.

DETAILED DESCRIPTION

Figure 1:
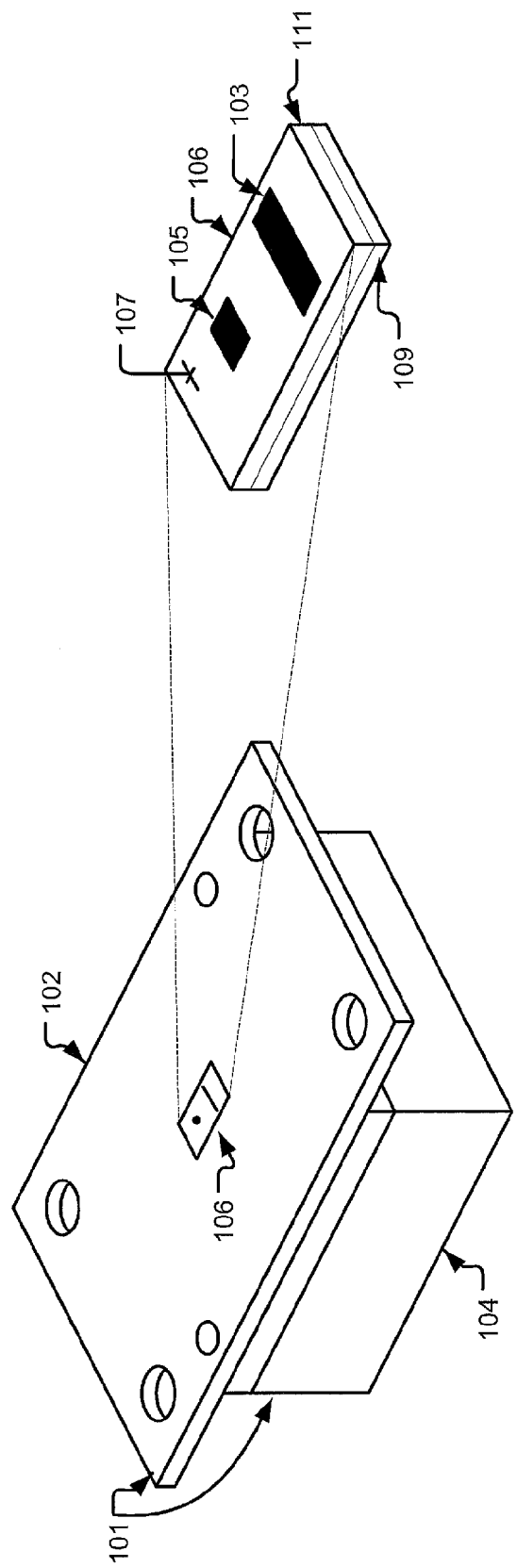
FIG. 1 is a perspective view of an example of an IC die attached to an example of a carrier.

Referring to FIG. 1, a particular embodiment of a system including a carrier 101 (e.g., a platform 102 of the carrier 101) defining a plurality of channels to route fluid to a second side (e.g., to a substrate) of an IC die 106 is illustrated. The IC die 106 may include a radio frequency (RF) power amplifier. The carrier 101 may include a platform 102 and a base 104.

The IC die 106 may include a semiconductor layer 111 proximate to (e.g., adjacent to, on, above, or connected to) a substrate 109. In some examples, the semiconductor layer 111 may include gallium nitride (GaN) and the substrate 109 may include silicon carbide.

Figure 2:
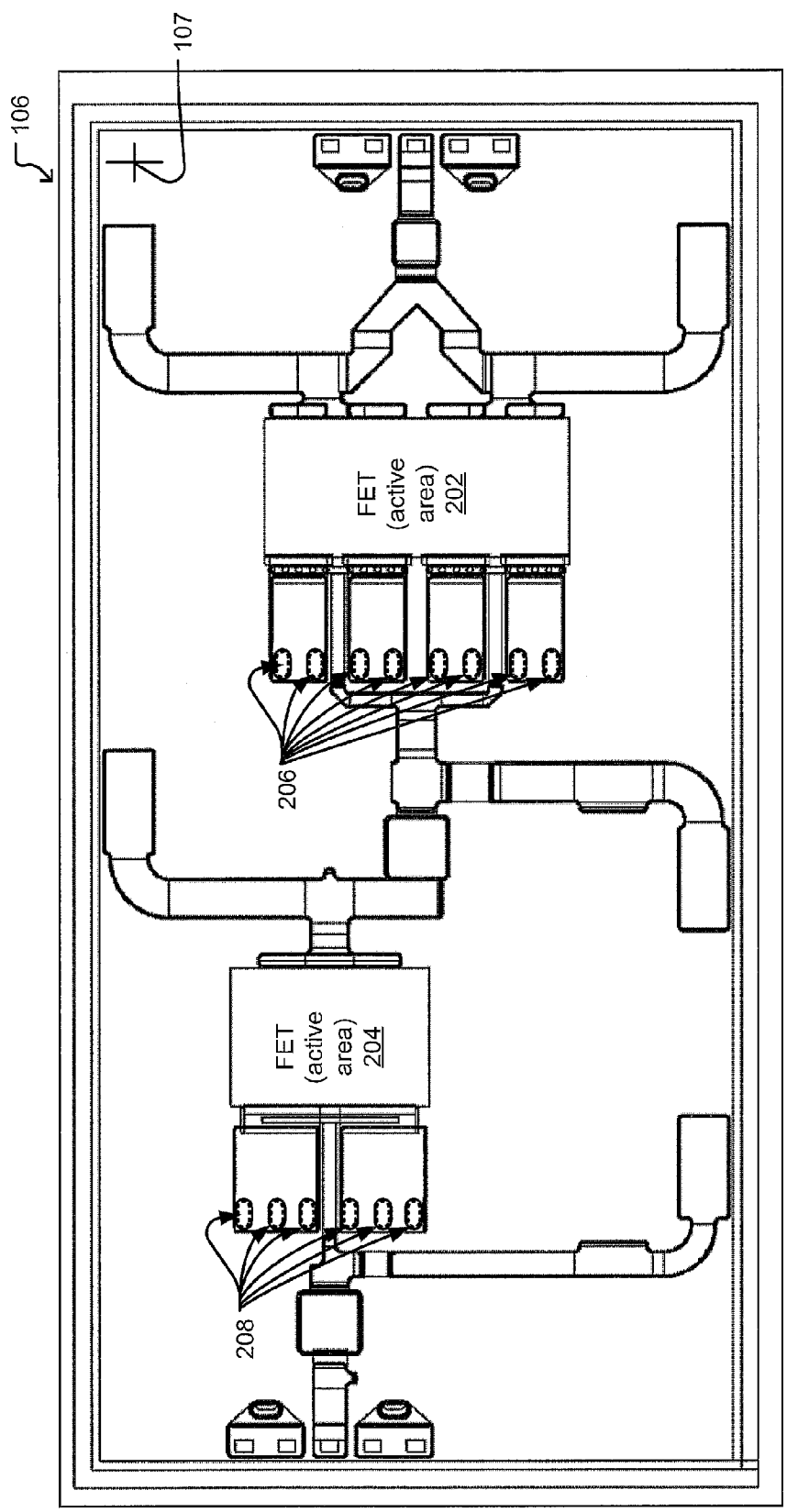
FIG. 2 is a top view of the example of the IC die of FIG. 1.

The IC die 106 may include a first side 107 opposite the second side. For example, FIG. 2 may illustrate an example of the first side 107 of the IC die 106 of FIG. 1. The IC die 106 may include one or more active areas of one or more components of the IC die 106. For example, the components may correspond to one or more transistors, such as one or more field effect transistors (FETs). To illustrate, the one or more active areas may include at least a first portion of a first active area of a first FET 202, and may include at least a second portion of a second active area of a second FET 204.

The second side of the IC die 106 may include one or more etch indents. For example, the one or more etch indents may be formed in the substrate 109 (e.g., the silicon carbide layer) of the IC die 106. The one or more etch indents may be formed using a lithographic or other etch process to etch the substrate 109. In some examples, a plating layer or surface may be applied to the substrate 109. The plating layer or surface may enable wetting between the IC die 106 and a die attach layer as described in more detail below. In examples that include a plating layer or surface on the substrate 109, the one or more etch indents may be formed by etching through portions of the plating layer or surface and into the substrate 109 using a lithographic or other etch process.

Figure 3:
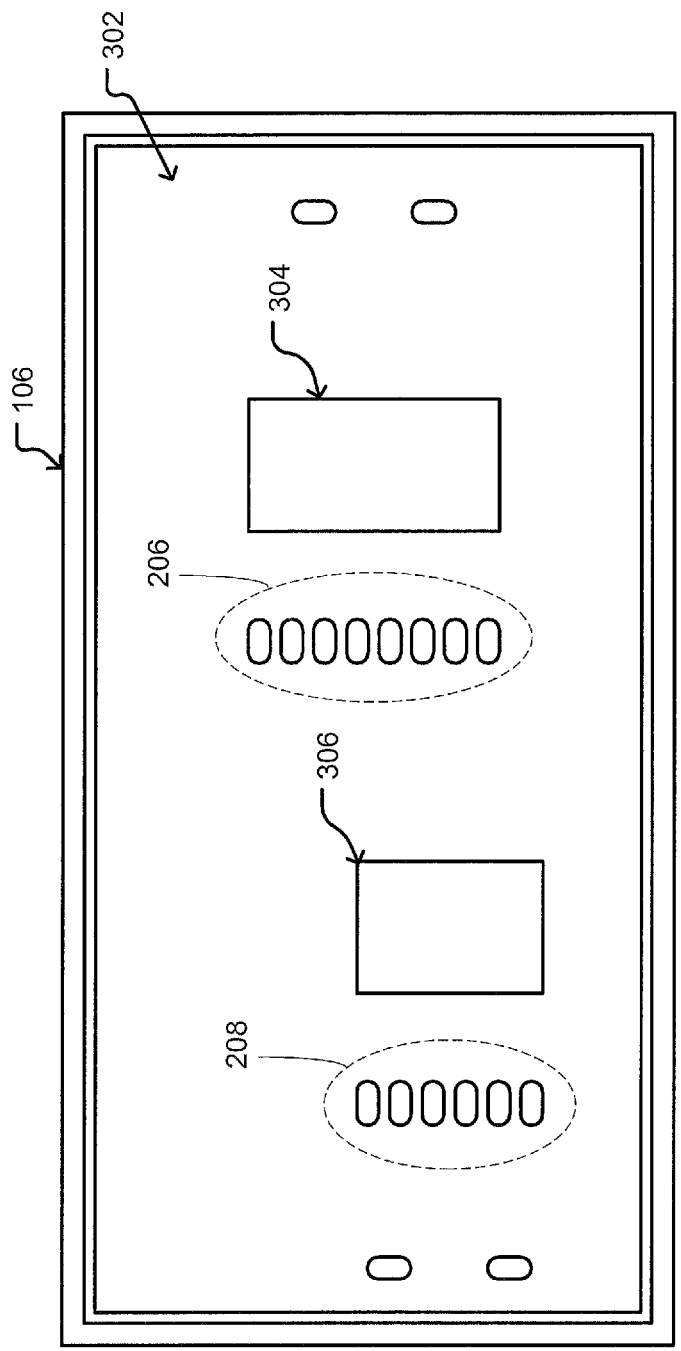
FIG. 3 is a bottom view of the example of the IC die of FIG. 1.

The one or more etch indents may be located proximate to the one or more active areas of the one or more components of the IC die 106. For example, FIG. 3 illustrates an example of a second side 302 of the IC die 106 of FIG. 1 opposite the first side 107 of the IC die 106. In this example, the second side 302 of the IC die 106 includes a first etch indent 304 proximate to the first active area of the first FET 202 of FIG. 2, and includes a second etch indent 306 proximate to the second active area of the second FET 204 of FIG. 2.

Figure 4:
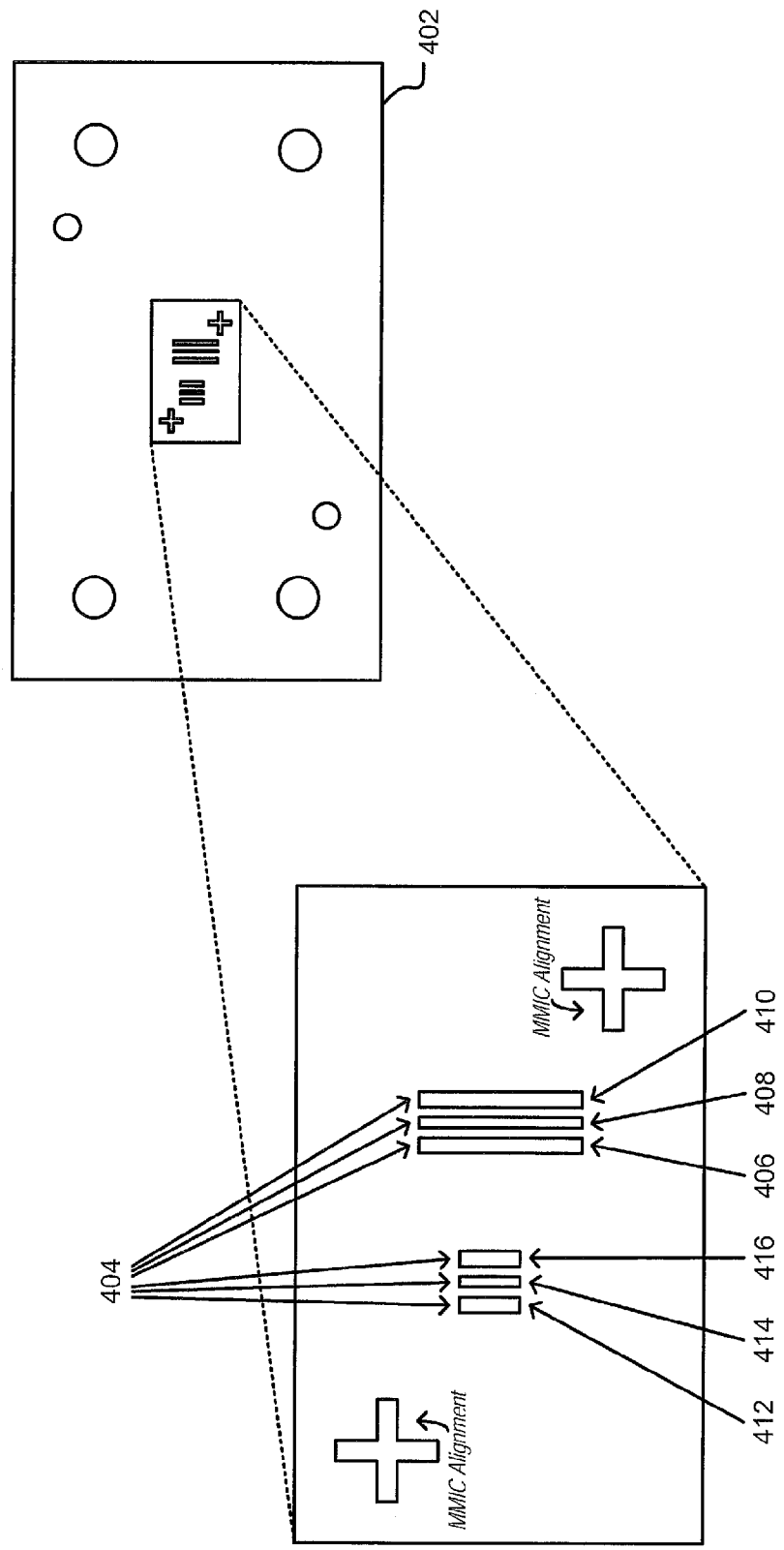
FIG. 4 is an example of a first layer of an example of a platform of the carrier of FIG. 1.
Figure 5:
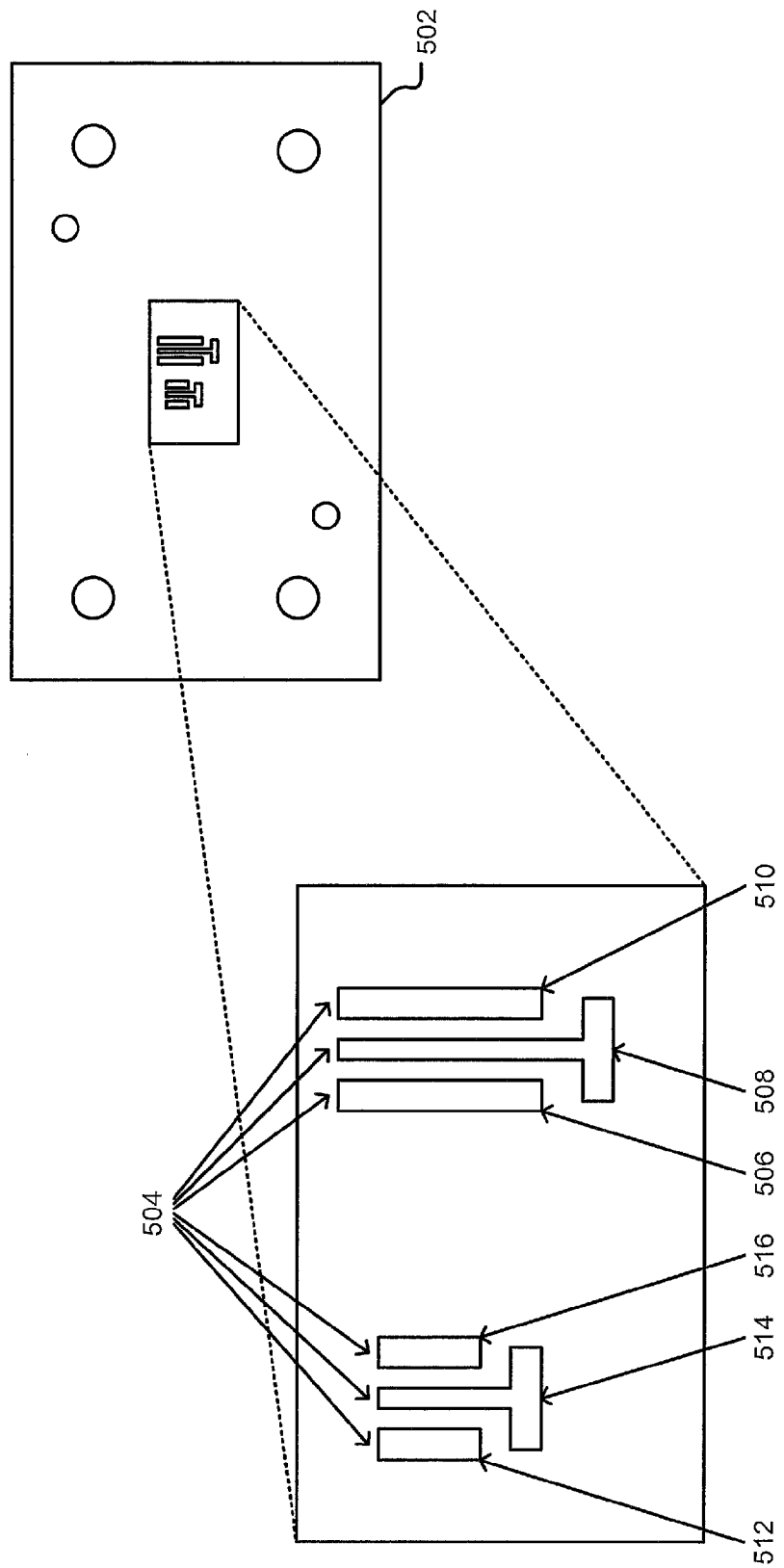
FIG. 5 is an example of a second layer of an example of a platform of the carrier of FIG. 1.
Figure 6:
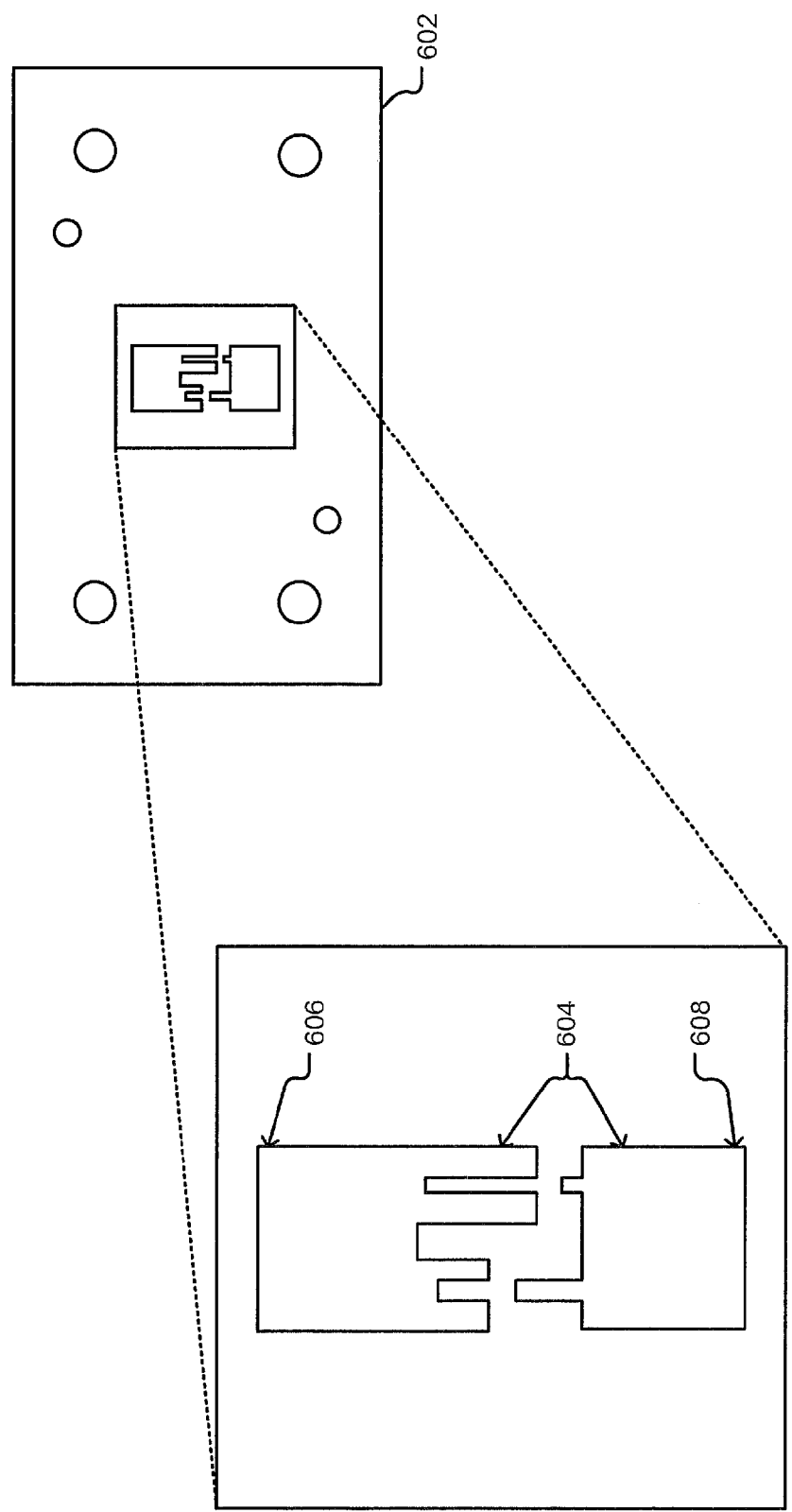
FIG. 6 is an example of a third layer of an example of a platform of the carrier of FIG. 1.

The plurality of channels defined by the carrier 101 of FIG. 1 (e.g., by the platform 102) may be configured to route the fluid to the one or more etch indents at the second side of the IC die 106. In some examples, the platform 102 may be formed using multiple layers that define different void areas, and the different void areas may collectively correspond to or may define the plurality of channels. For example, FIGS. 4, 5, and 6 illustrate examples of a first layer 402, a second layer 502, and a third layer 602, of the platform 102 of FIG. 1 that define different void areas. For example, the first layer 402 may define a first void area 404, the second layer 502 may define a second void area 504, and the third layer 602 may define a third void area 604. In some examples, the first layer 402 may be between the third layer 602 and the IC die 106, and the second layer 502 may be between the first layer 402 and the third layer 602.

In some examples, the first void area 404 may be smaller than the second void area 504 and may be smaller than the third void area 604. Alternatively or additionally, in some examples, the third void area 604 may be larger than the second void area 504 and may be larger than the first void area 404. Alternatively or additionally, in some examples, the third void area 604 may be larger than the second void area 504 and the second void area 504 may be larger than the first void area 404.

The first void area 404 may be formed of separate void portions. For example, the first void area 404 may be formed of a first void portion 406, a second void portion 408, a third void portion 410, a fourth void portion 412, a fifth void portion 414, and a sixth void portion 416. In some examples, the first layer 402 may have a thickness of about 5 mils. In some examples, the first void portion 406, the third void portion 410, the fourth void portion 412, and the sixth void portion 416 each have a width of approximately 4.1mils. In some examples, the second void portion 408 and the fifth void portion 414 each have a width of approximately 2.5 mils. In some examples, a distance between the first void portion 406 and the second void portion 408, a distance between the second void portion 408 and the third void portion 410, a distance between the fourth void portion 412 and the fifth void portion 414, and a distance between the fifth void portion 414 and the sixth void portion 416, is approximately 2.5 mils.

Figure 7:
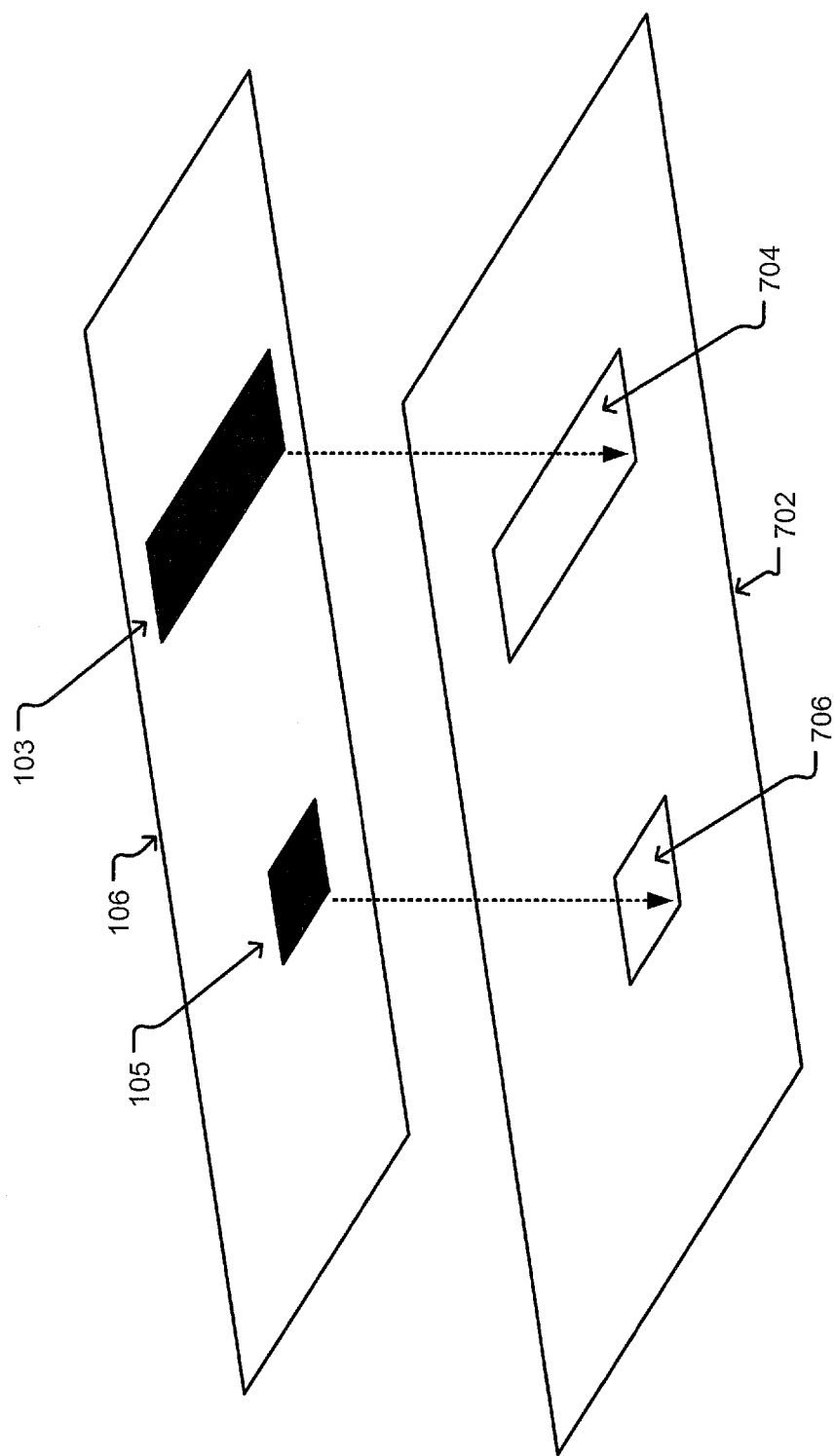
FIG. 7 is a perspective view of the IC die of FIG. 1 suspended above an example of a die attach layer.

During operation, in some examples, the fluid (coolant) may pass through the void portions 408 and 414 toward openings in a die attach layer [described below with reference to FIG. 7] and associated etch indents to cool the IC die 106. For example, the fluid may pass through the second void portion 408 toward and through a fust opening of the die attach layer and into the first etch indent 304 of FIG. 3. As another example, the fluid may pass through the fifth void portion 414 toward and through a second opening of the die attach layer and into the second etch indent 306 of FIG. 3.

Alternatively or additionally, fluid that has acquired heat from the IC die 106 and that is to be outlet (e.g., "exhaust fluid") may pass through the void portions 406, 410, 412, and/or 416. For example, exhaust fluid from the first etch indent 304 of FIG. 3 may pass through the first opening and through the void portions 406 and 410. As another example, exhaust fluid from the second etch indent 306 of FIG. 3 may pass through the second opening and through the void portions 412 and 416.

A first group of the separate void portions of the first void area 404 may be associated with (e.g., may partially define one or more channels to route fluid to and/or to receive fluid from) a particular etch indent. Alternatively or additionally, a second group of the separate void portions of the first void area 404 may be associated with (e.g., may partially define one or more channels to route fluid to and/or to receive fluid from) a different etch indent. For example, a first group including the first, second, and third void portions 406, 408, and 410 may be associated with a first etch indent (e.g., the first etch indent 304 of FIG. 3), and a second group including the fourth, fifth, and sixth void portions 412, 414, and 416 may be associated with a second etch indent (e.g., the second etch indent 306 of FIG. 3).

The second void area 504 may be formed of separate void portions. For example, the second void area 504 may be formed of a first void portion 506, a second void portion 508, a third void portion 510, a fourth void portion 512, a fifth void portion 514, and a sixth void portion 516. In some examples, the second layer 502 may have a thickness of about 6 mils. In some examples, the first void portion 506, the third void portion 510, the fourth void portion 512, and the sixth void portion 516 may each have a width of approximately 9.1 mils. In some examples, at least part of the second void portion 508 and at least part of the fifth void portion 514 may each have a width of approximately 2.5 mils. In some examples, a distance between the first void portion 506 and the second void portion 508, a distance between the second void portion 508 and the third void portion 510, a distance between the fourth void portion 512 and the fifth void portion 514, and a distance between the fifth void portion 514 and the sixth void portion 516, may be approximately 2.5 mils.

A first group of the separate void portions of the second void area 504 may be associated with (e.g., may partially define one or more channels to route fluid to and/or to receive fluid from) a particular etch indent. Alternatively or additionally, a second group of the separate void portions of the second void area 504 may be associated with (e.g., may partially define one or more channels to route fluid to and/or to receive fluid from) a different etch indent. For example, a first group including the first, second, and third void portions 506, 508, and 510 may be associated with a first etch indent (e.g., the first etch indent 304 of FIG. 3), and a second group including the fourth, fifth, and sixth void portions 512, 514, and 516 may be associated with a second etch indent (e.g., the second etch indent 306 of FIG. 3).

In some examples, the third layer 602 may have a thickness of about 30 mils. The third void area 604 may be formed of separate void portions. For example, the third void area 604 may be fanned of a first void portion 606 and a second void portion 608.

The first void portion 606 may be associated with multiple etch indents, and the second void portion 608 may be associated with multiple etch indents. For example, the first void portion 606 and the second void portion 608 may each be associated with (e.g., may partially define one or more channels to route fluid to and/or to receive fluid from) the first etch indent and the second etch indent. In some examples, the first void portion 606 of the third void area 604 may be used to provide fluid to the IC die 106, and the second void portion 608 of the third void area 604 may be used to receive fluid (e.g., exhaust) from the IC die 106.

In this example, the first void portion of the first layer, the first void portion of the second layer, and a first portion of the first and second void portions of the third layer may collectively define a first channel of the plurality of channels. Additionally or alternatively, the second void portion of the first layer, the second void portion of the second layer, and a second portion of the first and second void portions of the third layer may collectively define a second channel of the plurality of channels. The first channel (of the plurality of channels) described above may be configured to route fluid toward the first etch indent 304 of FIG. 3. The second channel (of the plurality of chamiels) described above may be configured to route fluid toward the second etch indent 306 of FIG. 3.

The system of FIG. 1 may include a die attach layer between the platform 102 and the second side of the IC die 106. In some examples, the die attach layer may be formed of or may include gold, tin, conductive epoxy, or a combination thereof.

The die attach layer may define one or more openings that enable the fluid to flow from the carrier 101 of FIG. 1 to the second side of the IC die 106. For example, FIG. 7 illustrates an unassembled perspective view of the IC die 106 suspended above a die attach layer 702 that includes a first opening 704 and a second opening 706. As described above, the second side of the IC die 106 may include etch indents proximate to one or more active areas of components at a first side of the IC die 106. For example, the second side of the IC die 106 may include a first etch indent proximate to the first active area of the first FET 103 and a second etch indent proximate to the second active area of the second FET 105. In this example, the first opening 704 may be located proximate to the first etch indent and the second opening 706 may be located proximate to the second etch indent. The die attach layer 702 may form at least a portion of a hermetic seal to retain the fluid.

Additionally, at least one of the one or more openings defined by the die attach layer may overlap at least a portion of at least one of the plurality of channels. For example, the first opening 704 may overlap the first channel of the plurality of channels and the second opening 706 may overlap the second channel of the plurality of channels. Thus, the first opening 704 may enable fluid to flow from the carrier 101 (e.g., from the first channel [of the plurality of channels] described above) to the first etch indent 304 of FIG. 3. The second opening 706 may enable fluid to flow from the carrier 101 (e.g., from the second channel [of the plurality of channels] described above) to the second etch indent 306 of FIG. 3.

Figure 10:
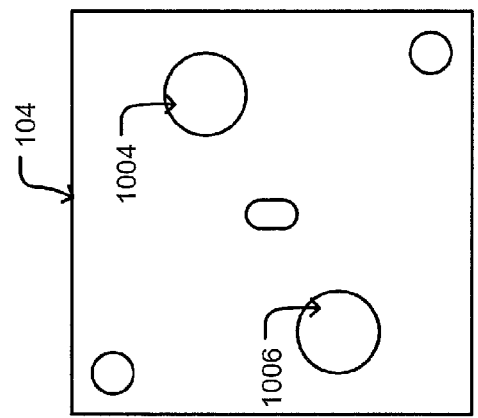
FIG. 10 is an outline of a second side of the base of FIG. 8.
Figure 8:
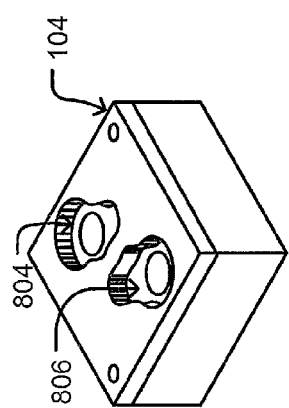
FIG. 8 is a perspective view of an example of a base of the carrier of FIG. 1.
Figure 9:
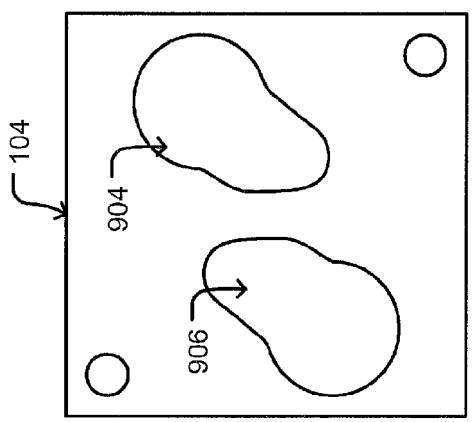
FIG. 9 is an outline of a first side of the base of FIG. 8.

The base 104 may include ports to route fluid to the plurality of channels defined by the platform 102. For example, FIG. 8 may illustrate a perspective view of the base 104 including a first port 804 and a second port 806. In some examples, the first port 804 may include a first portion and a second portion that are differently dimensioned. The second port 806 may include a first portion and a second portion that are differently dimensioned. For example, FIG. 9 illustrates an outline of a first side (e.g., a top side) of the base 104 of FIG. 8, and FIG. 10 illustrates an outline of a second side (e.g., a bottom side) of the base 104 of FIG. 8. Port portions 904 and 906 of FIG. 9 may correspond to the first portion of the first port 804 and to the first portion of the second port 806, respectively. Port portions 1004 and 1006 of FIG. 10 may correspond to the second portion of the first port 804 and to the second portion of the second port 806 of FIG. 8, respectively.

In some examples, the first port 804 corresponds to an inlet port to provide fluid to the plurality of channels defined by the platform 102 (and to the etch indents of the IC die 106). Additionally or alternatively, the second port 806 may operate as an outlet port to receive fluid from the plurality of channels defined by the platform 102. In some examples, a void portion of the platform 102 overlaps at least a portion of one of the ports and does not overlap another of the ports. For example, at least a portion of the void portion 606 may overlap at least a portion of the first port 904 and may not overlap any of the second port 906. Additionally or alternatively, at least a portion of the void portion 608 may overlap at least a portion of the second port 906 and may not overlap any of the first port 904. Thus, fluid may be routed to the one or more etch indents through the first port 804 and the first channel of the plurality of channels described above and fluid may be routed away from the one or more etch indents through the second channel of the plurality of channels described above and through the second port 806.

Figure 11:
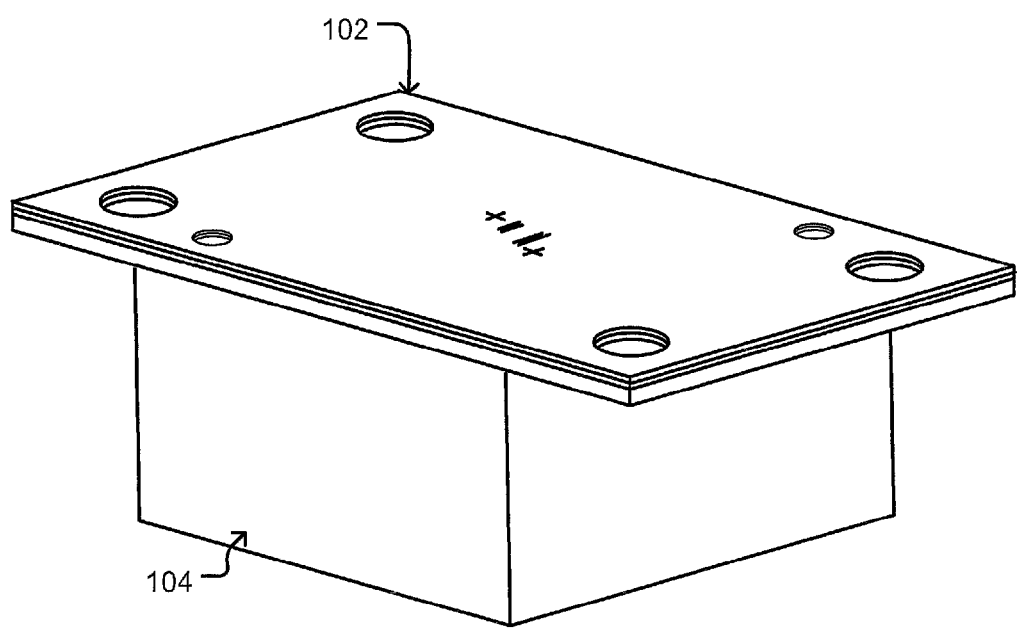
FIG. 11 is a perspective view of the carrier of FIG. 1.
Figure 12:
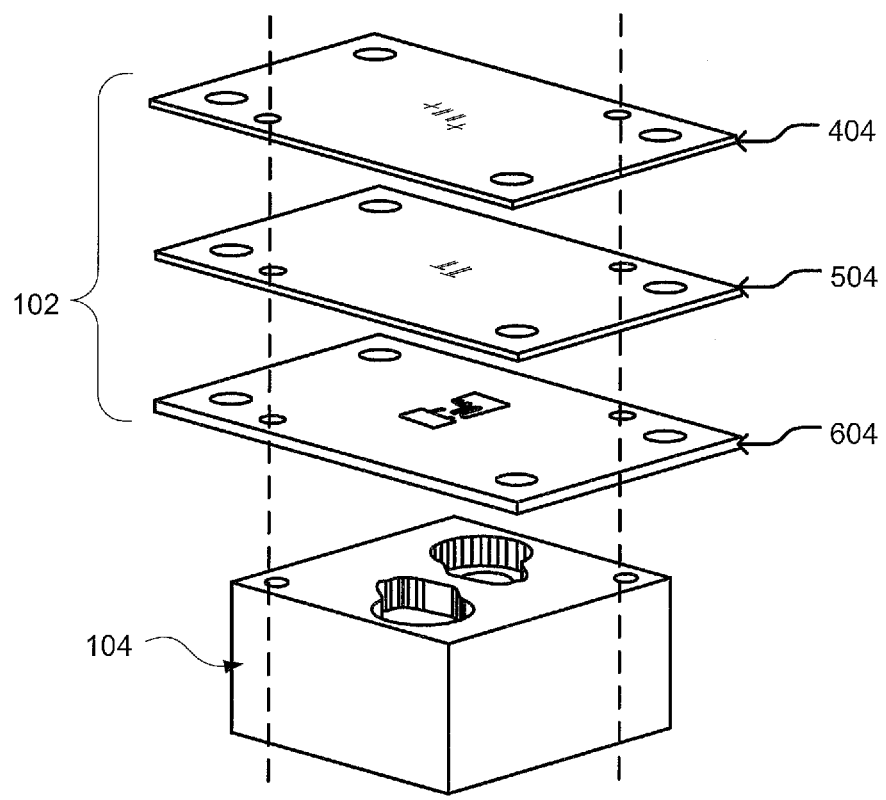
FIG. 12 is a partially unassembled perspective view of the carrier of FIG. 1.

The platform 102 may be coupled to the base 104. For example, FIG. 11 illustrates the platform 102 coupled to the base 104 prior to attaching the IC die 106 of FIG. 1, and FIG. 12 illustrates an unassembled perspective view of the base 104 and the platform 102 of FIG. 11. In some examples, the first layer, the second layer, and the third layer of the platform 102 are aligned with the base 104. In some examples, the platform 102 and the base 104 include apertures (through which the broken lines of FIG. 12 pass) and the platform 102 may be aligned with the base 104 using dowels disposed through the apertures. In some examples, subsequent to aligning the base 104 and the platform 102, the base 104 and the platform 102 are bonded (e.g., diffusion bonded) together.

The IC die 106 may include part of one or more electrically conductive paths between the first side 107 of the IC die 106 and the carrier 101. For example, each of the one or more electrically conductive paths may include a conductive via portion that extends through the IC die 106 and is attached to the die attach layer 702 of FIG. 7 (which is may be attached to the carrier 101). Thus, the die attach layer 702 may provide part of a conductive path to the carrier 101. To illustrate, conductive vias 206 and conductive vias 208 may extend through the IC die 106 and each conductive via of the conductive vias 206 and 208 may form (along with the die attach layer 702 of FIG. 7) part of an electrically conductive path to the carrier 101. Each conductive via of the conductive vias 206 and 208 may serve as a radio frequency (RF) ground for an associated component of the IC die 106.

During operation of the system of FIG. 1, coolant (e.g., fluid) may be provided to one or more inlet ports defined by the base 104. For example, the fluid may be provided to the first port 804. The fluid passes through the first port 804 to the platform. Within the platform, the fluid may be routed through the first channel (of the plurality of channels) described above to the die attach layer. Within the die attach layer, the fluid may pass through one or more of the openings to the one or more etch indents. For example, the fluid that is passed through the first channel of the plurality of channels may pass through the first opening 704 of FIG. 7 and/or the second opening 706 to the first etch indent 304 and/or the second etch indent 306, respectively. At the etch indent, the fluid may acquire heat from the IC die 106. In some examples, acquisition of heat by the fluid may cause at least a portion of the fluid to change state. In some examples, only some of the fluid changes state, resulting in a multi-phase fluid.

The exhaust fluid from the first etch indent 304 and/or the exhaust fluid from the second etch indent 306 may pass through the first opening 704 and/or the second opening 706 to the second channel of the plurality of channels described above. The second channel may route the exhaust fluid from the first etch indent 304 and/or the exhaust fluid from the second etch indent 306 to the second port 806.

Thus, the system of FIG. 1 may include routing ports, channels, and openings configured to provide cooling fluid to, and receive exhaust fluid from, an IC die. Providing the cooling fluid to the IC die may enable heat from the IC die to be acquired without the heat passing through layers external to the IC die, which may improve thermal control of the IC die relative to systems that acquire heat from the IC die after the heat is conducted through layers external to the IC die. Improving thermal control of the IC die when the IC die includes high-power circuitry (e.g., high-power radio frequency (RF) circuitry) may enable the high-power circuitry to operate at a higher power (e.g., may increase an allowable power output of the IC die or the RF circuitry).

Figure 13:
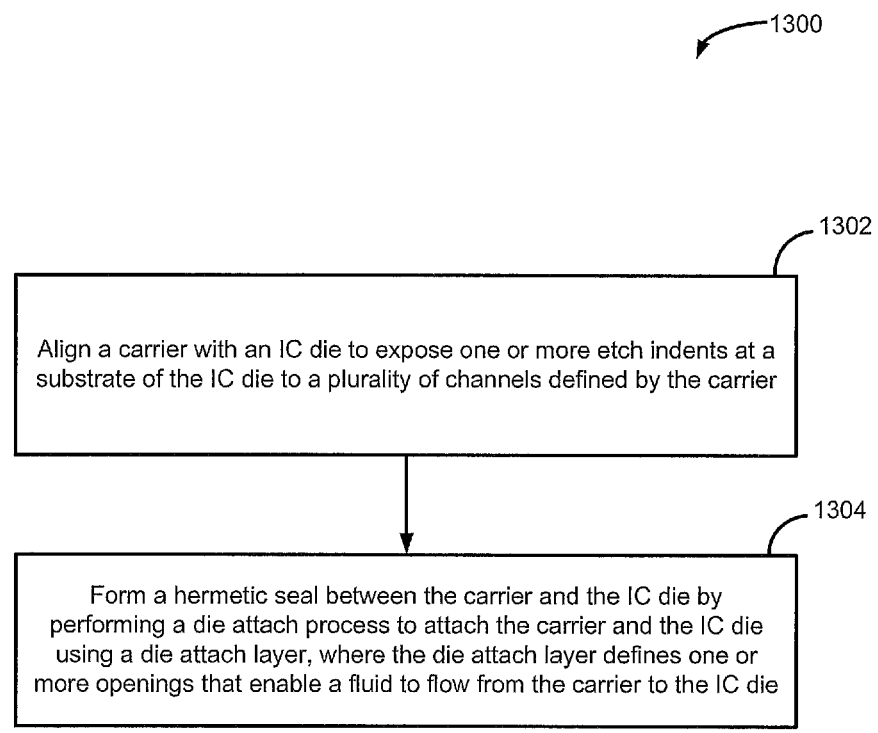
FIG. 13 is a flowchart depicting an exemplary embodiment of a method of attaching IC die of FIG. 1 to the carrier of FIG. 1.

FIG. 13 is a flowchart depicting an exemplary embodiment of a method 1300 of assembling a system including a carrier defining a plurality of channels to route fluid (e.g., coolant) to an IC die. The IC die may correspond to the IC die 106 of FIG. 1, the carrier may correspond to the carrier 101 of FIG. 1, the plurality of channels may correspond to the first and second channels described above with reference to FIGS. 1, 4, 5, and 6. For illustrative purposes, description of the method 1300 is focused on assembly of the system. However, different IC dies (e.g., different components and/or different etch indents), different carriers (e.g., different number of layers and/or dimensions), and/or different plurality of channels (e.g., a different number of channels and/or differently dimensioned channels) may be assembled.

The method 1300 includes, at 1302, aligning (e.g., using alignment features, such as fiducial markings, of the IC die and the carrier) the carrier 101 with the IC die 106 to expose one or more etch indents at a substrate of the IC die 106 to the plurality of channels defined by the carrier 101. The one or more etch indents may correspond to one or more of the first etch indent 304 or the second etch indent 306 of FIG. 3 and the substrate may correspond to the substrate 109 of FIG. 1. As described above, a die attach layer may be located between the IC die 106 and the carrier 101, and the die attach layer may include one or more openings.

The method 1300 includes, at 1304, forming a hermetic seal between the carrier 101 and the IC die 106 by perforating a die attach process to attach the carrier 101 and the IC die using the die attach layer. The die attach layer may define one or more openings that enable the fluid to flow from the carrier 101 to the IC die 106. For example, the die attach layer may correspond to the die attach layer 702 of FIG. 7 and the one or more openings may correspond to the first opening 704 and/or the second opening 706. In this example, each opening of the one or more openings may be aligned with an associated indent of the one or more etch indents (e.g., described above with reference to FIG. 3) such that each opening of the one or more openings is proximate to the etch indent of the one or more etch indents associated with the opening. For example, the first opening 704 may be aligned with the first etch indent 304 of FIG. 3 and may enable the fluid to flow through the first channel described above to the first etch indent 304. As another example, the second opening 706 of FIG. 7 may be associated with the second etch indent 306 of FIG. 3 and may enable the fluid to flow through the second channel described above to the second etch indent 306. The die attach process may include subjecting the die attach layer (702 of FIG. 7), the IC die 106 (of FIG. 1), and the platform 102 to controlled heat to cause reflow of the die attach layer 702. Additionally, a sealing layer (e.g., a polymer layer) may be applied over the system of FIG. 1.

In some examples, the IC die 106 may include at least part of one or more electrically conductive paths as described above with reference to FIG. 2. In these examples, the method 1300 may further include electrically coupling a side of the IC die 106 (e.g., the first side 107 of FIG. 1) opposite the substrate 109 to the carrier 101 via the one or more electrically conductive paths.

Thus, FIG. 13 illustrates a method of assembling a system that enables fluid (e.g., coolant) to be applied directly to an IC die and that uses a die attach layer between the IC die and the carrier to hermetically seal a path from the carrier to the IC die.

Embodiments described above are illustrative and do not limit the disclosure. It is to be understood that numerous modifications and variations are possible in accordance with the principles of the present disclosure.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. A device comprising:
    a carrier defining a plurality of channels; and
    an integrated circuit (IC) die having a first side and having a second side opposite the first side, the second side of the IC die coupled to the carrier, the IC die including part of an electrically conductive path between the first side of the IC die and the carrier, the plurality of channels configured to route a fluid to a first portion of the second side of the IC die, wherein the electrically conductive path includes a second portion of the second side of the IC die, and wherein the first portion of the second side of the IC die is distinct from the second portion of the second side of the IC die.

2. The device of claim 1, wherein the first portion of the second side of the IC die corresponds to an etch indent in the IC die, and wherein at least one of the plurality of channels is configured to route the fluid through the etch indent.

3. The device of claim 1, wherein the IC die includes a field effect transistor, wherein the first side of the IC die includes an active region of the field effect transistor, wherein the active region at least partially overlaps the second portion of the second side of the IC die, and wherein the second portion of the second side of the IC die does not overlap the active region.

4. The device of claim 1, wherein the IC die includes part of a second conductive path between the first side of the IC die and the carrier, wherein at least one of the plurality of channels is configured to route the fluid to a third portion of the second side of the IC die, wherein the electrically conductive path includes a fourth portion of the second side of the IC die, wherein the first portion of the second side of the IC die is distinct from the fourth portion of the second side of the IC die, wherein the third portion of the second side of the IC die is distinct from the second portion of the second side of the IC die or the fourth portion of the second side of the IC die.

5. The device of claim 4, wherein wherein the second portion of the IC die is located between the first portion of the second side of the IC die and the third portion of the IC die, and wherein the third portion of the IC die is located between the second portion of the second side of the IC die and the fourth portion of the IC die.

6. The device of claim 1, wherein the carrier includes a base and a platform, wherein the base is coupled to the platform and defines a plurality of ports, wherein the platform includes at least three layers to define the plurality of channels, wherein the at least three layers include a first layer having a first void area, a second layer having a second void area, and a third layer having a third void area, wherein the plurality of channels is defined by the first void area, the second void area, and the third void area.

7. The device of claim 6, wherein the first void area is smaller than the second void area and the second void area is smaller than the third void area, wherein the third void area is defined by at least two separate void portions, wherein the second void area is defined by at least six separate void portions and the first void area is defined by at least six separate void portions, and wherein the first layer is between the third layer and the IC die and the second layer is between the first layer and the third layer.

8. The device of claim 6, wherein the second void area overlaps a portion of the third void area, and wherein the first void area overlaps a portion of the second void area.

9. A device comprising:
    a carrier defining a plurality of channels;
    an integrated circuit (IC) die having a first side and having a second side opposite the first side, the second side of the IC die coupled to the carrier, the IC die including part of an electrically conductive path between the first side of the IC die and the carrier; and
    a seal between the carrier and the second side of the IC die, wherein the seal attaches the carrier to the second side of the IC die, and wherein the seal has a plurality of openings that enable a fluid to flow from the carrier to a first portion of the second side of the IC die, wherein the electrically conductive path includes a second portion of the second side of the IC die, and wherein the first portion of the second side of the IC die is distinct from the second portion of the second side of the IC die.

10. The device of claim 9, wherein the seal is formed of gold, tin, conductive epoxy, or a combination thereof.

11. The device of claim 9, wherein at least one of the plurality of openings overlaps at least a portion of the plurality of channels.

12. The device of claim 9, wherein the carrier, the plurality of openings, and the second side of the IC die define a cavity to receive the fluid.

13. The device of claim 9, wherein the seal forms a hermetic seal between the carrier and the second side of the IC die.

14. The device of claim 9, wherein the second side of the IC die includes multiple etch indents, and wherein at least a portion of each etch indent of the multiple etch indents is proximate to at least a portion of a corresponding opening of the plurality of openings.

15. The device of claim 9, wherein the seal provides part of the electrically conductive path between the carrier and the first side of the IC die.

16. A method of assembling, comprising:
    aligning a carrier with an integrated circuit (IC) die to expose an etch indent at a substrate of the IC die to a plurality of channels defined by the carrier, the IC die having a first side and having a second side opposite the first side, the etch indent corresponding to a first portion of the second side of the IC die; and
    forming a hermetic seal between the carrier and the IC die by performing a die attach process to attach the carrier and the IC die using a die attach layer positioned between the IC die and the carrier, the hermetic seal coupling the second side to the carrier, wherein the die attach layer defines one or more openings that enable a fluid to flow from the carrier to the etch indent, wherein the die attach process includes subjecting the carrier, the die attach layer, and the IC die to controlled heat to cause reflow of the die attach layer, wherein the IC die includes part of an electrically conductive path between the first side of the IC die and the carrier, wherein the electrically conductive path includes a second portion of the second side of the IC die, and wherein the first portion of the second side of the IC die is distinct from the second portion of the second side of the IC die.

17. The method of claim 16, further comprising electrically coupling the second side of the IC die to the carrier via the electrically conductive path.

18. The method of claim 16, wherein each opening of the one or more openings defined by the die attach layer is aligned with the etch indent such that each opening of the one or more openings is proximate to the etch indent.

19. The device of claim 6, wherein each port of the plurality of ports includes a first portion at a first side of the base and a second portion at a second side of the base, wherein the second side is opposite the first side, and wherein the first portion of each port of the plurality of ports has different dimensions than the second portion of each port of the plurality of ports.

20. The device of claim 19, wherein a first void portion of the third void area overlaps a first port of the plurality of ports, wherein a second void portion of the third void area overlaps a second port of the plurality of ports, and wherein the electrically conductive path serves as a radio frequency (RF) ground for a component of the IC die.

\* \* \* \* \*